United States Patent
Kawase et al.

(10) Patent No.: US 6,339,365 B1
(45) Date of Patent: Jan. 15, 2002

(54) SURFACE ACOUSTIC WAVE DEVICE COMPRISING FIRST AND SECOND CHIPS FACE DOWN BONDED TO A COMMON PACKAGE GROUND

(75) Inventors: Minoru Kawase, Fujisawa; Yasushi Kuroda, Asahikawa, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/472,813

(22) Filed: Dec. 28, 1999

(30) Foreign Application Priority Data

Dec. 29, 1998 (JP) ............................. 10-377256
Oct. 18, 1999 (JP) ........................... 11-294747

(51) Int. Cl.[7] ............................. H03H 9/64; H03H 9/72
(52) U.S. Cl. .................... 333/193; 333/133; 310/313 R
(58) Field of Search ...................... 333/133, 193–196; 310/313 R, 344, 346–349

(56) References Cited

U.S. PATENT DOCUMENTS

| | | | |
|---|---|---|---|
| 4,163,201 A | * | 7/1979 | Takahashi et al. ........... 333/194 |
| 4,737,742 A | * | 4/1988 | Takoshima et al. ....... 333/193 X |
| 4,795,934 A | * | 1/1989 | Rogerson et al. .... 310/313 B X |
| 5,202,652 A | * | 4/1993 | Tabuchi et al. ......... 333/133 X |
| 5,252,882 A | * | 10/1993 | Yatsuda ................... 310/348 X |
| 5,281,883 A | * | 1/1994 | Ikata et al. ........... 310/313 B X |
| 5,459,368 A | * | 10/1995 | Onishi et al. ................ 310/344 |
| 5,949,305 A | * | 9/1999 | Shimamura .................. 333/193 |
| 6,078,229 A | * | 6/2000 | Funada et al. ............... 333/193 |

FOREIGN PATENT DOCUMENTS

| | | | |
|---|---|---|---|
| JP | 9-51206 | | 2/1997 |
| JP | 10-70435 | * | 3/1998 |
| JP | 2000-59174 | * | 2/2000 |

* cited by examiner

Primary Examiner—Robert Pascal
Assistant Examiner—Barbara Summons
(74) Attorney, Agent, or Firm—Oblon, Spivak, McClelland, Maier & Neustadt, P.C.

(57) ABSTRACT

An object of the present invention is to provide a filter that enables to manufacture in a multi-chip package with ease and that is of small size and multi-function or multi-mode. In a constitution of the present invention, a filter comprises a package comprising a base on one main surface thereof a conductor is formed, and a plurality of surface acoustic wave chips comprising a plurality of interdigital transducers formed on one main surface of a piezoelectric substrate, signal terminals disposed on facing sides on the piezoelectric substrate, and ground terminals disposed on the piezoelectric substrate. Here, the plurality of surface acoustic wave chips, at the signal terminals and the ground terminals, is bonded to the conductor in a face down way.

17 Claims, 9 Drawing Sheets

SURFACE ACOUSTIC WAVE DEVICE COMPRISING FIRST AND SECOND CHIPS FACE DOWN BONDED TO A COMMON PACKAGE GROUND

BACKGROUND OF THE INVENTION

1. Field of the Invention

The present invention relates to a surface acoustic wave device comprising inter-digital-transducers (hereinafter refers to as IDT) formed on a piezoelectric substrate.

2. Description of the Related Art

So far, surface acoustic wave devices, due to small size, high performance and high reliability thereof, have been used in various fields. For instance, in the field of radio communication such as portable telephones or the like, the surface acoustic wave devices are used as band-pass filters for transmission, band-pass filters for reception or the like.

In the field of radio communication as such, there is a tendency toward allowing coexistence of two or more systems of different frequency bands. For instance, in North America and so on there exist two systems of PCS of 1.9 GHz band and AMPS of 800 MHz band, in Europe and so on two systems of DCS of 1.8 GHz band and GSM of 900 MHz band, and in Japan a plurality of systems of PHS of 1.9 GHz band, PDC1.5G of 1.5 GHz band and PDC800 of 800 MHz band.

Accordingly, there is a recent tendency demanding dual-type radio communication units that can materialize communication in two or more systems of different frequency bands with one unit. In such dual-type radio communication units, various kinds of components can be used in common. Accordingly, compared with the case where one radio communication unit is prepared for each of different systems, from a viewpoint of total cost and size, there is a considerable merit.

For a surface acoustic wave device capable of coping with such a dual-type radio communication unit, one in which a plurality of surface acoustic wave chips operating in mutually different frequency bands is accommodated in one package can be used. As a result of this, the surface acoustic wave device can be made small and less expensive.

In a surface acoustic wave device, ordinarily surrounding an area thereon a surface acoustic wave chip is mounted, bonding pads are disposed for supplying input signals and ground potential to IDTs from external portions, or extracting output signals. These bonding pads and terminals of the IDTs are connected with bonding wires.

In the case of accommodating a plurality of surface acoustic wave chips as such in one package to prepare so-called multi-chip package, terminals of the IDTs are connected to a bonding pad on one side of each chip. Accordingly, depending on locations of the terminals of the IDTs, the lengths of the bonding-wires can be different.

As a result of this, in the case of arranging a plurality of IDTs along a main propagation direction of surface acoustic waves such as in particular in a longitudinal mode-coupled resonant filter, an influence of a capacitance component parasitic on the bonding wire and an inductance component is different for each IDT. Thereby, it is likely to cause difficulty in adjusting frequency characteristics. Further, when the bonding-wire goes over the IDT, electromagnetic coupling tends to occur between the bonding-wire and the IDT.

SUMMARY OF THE INVENTION

The present invention is carried out for improving a surface acoustic wave device and has the following objects.

(1) To provide a surface acoustic wave device easy in packaging in a multi-chip package.

(2) To provide a surface acoustic wave device having IDTs(inter-digital transducer) of even characteristics through homogenizing parasite capacitance components and inductance components for all IDTs.

(3) To prevent signal and noise from mingling due to electromagnetic coupling between bonding-wires and IDTs.

(4) To provide a surface acoustic wave device of small size.

A surface acoustic wave device of the present invention comprises a package and a plurality of surface acoustic wave chips. Here, the package comprises a base on one main surface thereof a conductor is disposed. The plurality of surface acoustic wave chips comprises a plurality of IDTs formed on one main surface of a piezoelectric substrate, signal terminals disposed on both opposite sides on the piezoelectric substrate, and a ground terminal disposed on the piezoelectric substrate. Here, the plurality of surface acoustic wave chips, at the signal terminals and the ground terminal, are bonded to the conductor in a face down way.

In a surface acoustic wave device of the present invention, power supply to and extraction of output from each IDT terminal of multi-chips are implemented through a conductor on a base. Accordingly, the difference of an influence of the parasite capacitance components and the inductance components due to locations of the IDT terminals and an influence of electromagnetic coupling can be alleviated. As a result of this, multi-chip packages can be manufactured with ease.

Further, on the base signal conductors corresponding to a plurality of signal terminals of a chip may be formed and on an area between these adjacent signal conductors part of ground conductor may be formed. Thereby, since electromagnetic coupling between adjacent signal conductors can be shielded by the ground conductor that is intervened therebetween, an influence of the electromagnetic coupling between the signal conductor can be alleviated.

In addition, all of the IDTs may be disposed facing the ground conductor. Thereby, the IDTs can be prevented from being mingled with electrical signal and noise.

At least one of surface acoustic wave chips may be constituted of a plurality of surface acoustic wave filters connected in a cascade connection.

At least one of surface acoustic wave chips can be constituted of a longitudinal mode-coupled surface acoustic wave element.

A longitudinal mode-coupled surface acoustic wave resonant filter, one example thereof, is normally constituted by arranging a plurality of IDTs and reflectors disposed at both ends sandwiching these IDTs in rows along a direction of propagation of surface acoustic waves on a piezoelectric substrate. As a result of this, in addition to a fundamental wave of surface acoustic waves, a higher mode thereof can be extracted. As a result of this, a filter of a broader band can be obtained.

When mounting this longitudinal mode-coupled surface acoustic wave resonator as a multi-chip, according to the present invention, fluctuation of value of parasite capacitance and value of inductance of each IDT can be alleviated. As a result of this, surface acoustic waves of higher mode can be efficiently extracted.

In a surface acoustic wave device of the present invention, an external selection circuit may be disposed to supply input signal selectively to any one of a plurality of surface acoustic wave chips, resulting in constituting a filter that can be switched.

Propagation characteristics of a piezoelectric substrate of at least one chip of surface acoustic wave chips may be different from that of other surface acoustic wave chips.

Without restricting to the propagation characteristics of the substrate, thickness of electrode fingers and constituent material of the electrode fingers (including composition or layer structure), or duty ratio (width of an electrode finger/distance between centers of electrode fingers) of the electrode fingers can be made different from those of other surface acoustic wave chips.

An external dimension of at least one chip of the surface acoustic wave chips may be different from that of other chips. Thereby, the chips can be distinguished with ease. Here, by designing the piezoelectric substrates to the minimum dimension required by each filter, low cost and lightweight can be realized.

When, as the external dimension, thicknesses of the piezoelectric substrates are differentiated according to the kinds of the surface acoustic wave chips, the surface acoustic wave chips can be conveniently distinguished with ease during and after mounting of the chips. It is preferable for the difference of the thicknesses of the substrates to be 20 $\mu$m or more for easy distinction.

In mounting the chips on a package, the chips can be mounted in order of thickness from one that is thin in its substrate thickness. Thereby, a mounting tool and a surface acoustic wave chip can be prevented from interfering with each other, resulting in easy mounting.

When a thickness of a piezoelectric substrate of at least one chip of surface acoustic wave chips is made different from that of other surface acoustic wave chips, according to bandwidth and rise transition characteristics required for the respective surface acoustic wave elements, the piezoelectric substrates of optimum thicknesses can be used.

Surface roughness of a rear surface of at least one chip of the surface acoustic wave chips can be made different from that of other chips. Thereby, the chips can be distinguished with ease.

DESCRIPTION OF THE PREFERRED EMBODIMENTS

In the following, embodiments of the present invention will be explained with reference to the drawings.
(Embodiment 1)

Figure 1:
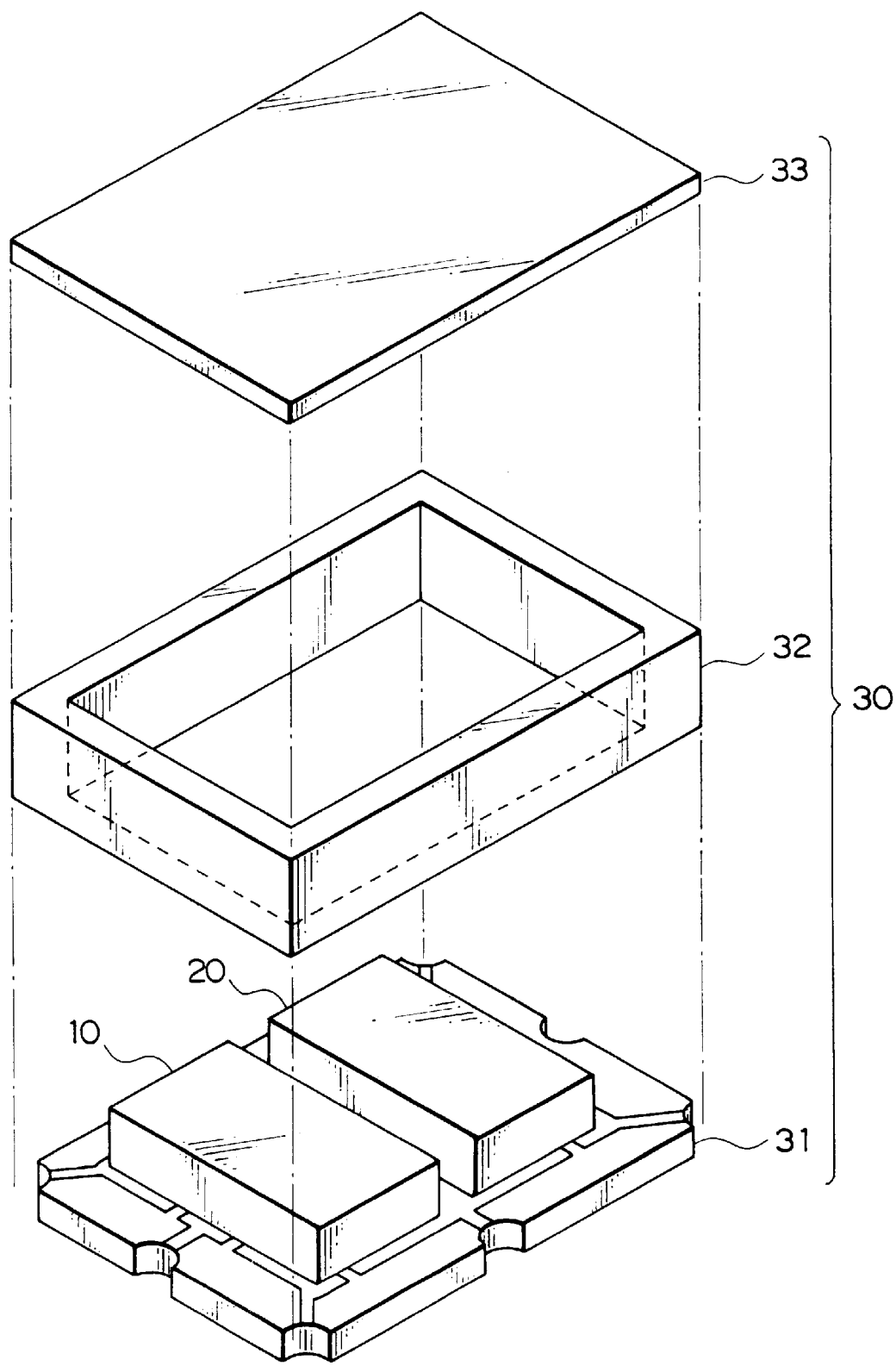
FIG. 1 is an exploded perspective view showing a surface acoustic wave device involving one embodiment of the present invention.

FIG. 1 is an exploded perspective view showing a surface acoustic wave device 1 involving a first embodiment of the present invention. In this embodiment, a surface acoustic wave device 1 is constituted as a dual-filter having two filters of a lower band-pass filter and a higher bandpass filter.

As shown in this figure, two surface acoustic wave chips 10 and 20 are accommodated inside of a package 30 of an external shape of rectangular parallelepiped. Here, the surface acoustic wave chips 10 and 20 constitute a lower band-pass filter and a higher band-pass filter, respectively.

A package 30 is composed of a base 31, an external circumference 32 and a cap 33 constituting a bottom, a sidewall and an upper plate, respectively.

The base 31, the external circumference 32 and the cap 33 are adhered to seal the package 30. As a result of this, the surface acoustic wave chips 10 and 20 are protected sealed airtight within the package 30.

Figure 2:
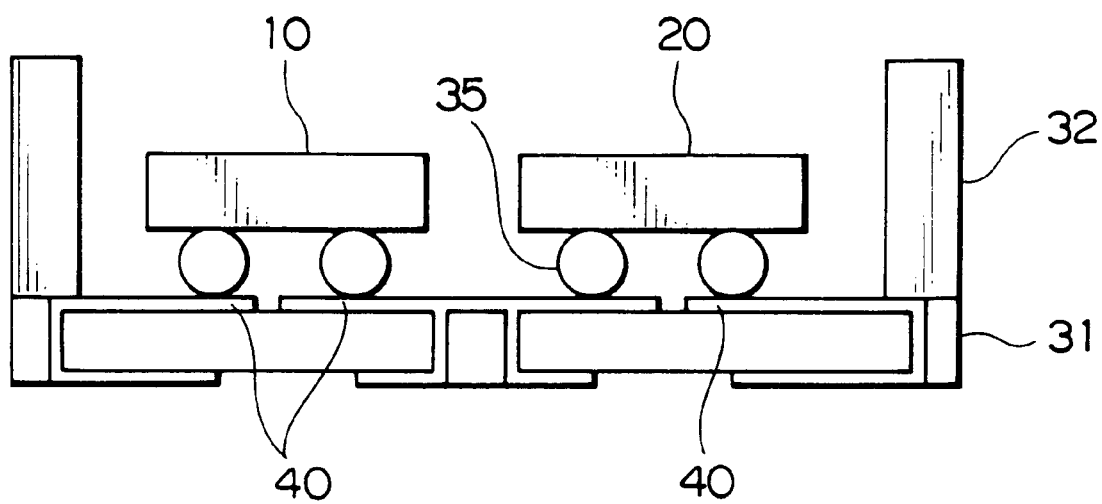
FIG. 2 is a cross-section showing a surface acoustic wave device involving one embodiment of the present invention.

FIG. 2 is a cross-section showing a surface acoustic wave device 1 shown in FIG. 1 with the cap 33 removed.

To the base 31 of ceramics or plastics, the external circumference 32 is connected. On the base 31, the surface acoustic wave chips 10 and 20 are mounted with a formation surface of IDTs (inter digital transducers) thereof directed downwards.

Terminals of the IDTs are connected to a conductor 40 formed on an upper surface of the base 31 through a bump 35. In this flip-chip mounting, gold is used for the bump 35, gold being able to connect by use of ultra-sound. Here, solder also can be used as material of the bump 35. The conductor 40 is connected to electrical wiring leading to a rear surface of the base 31 through through-holes.

Figure 3A:
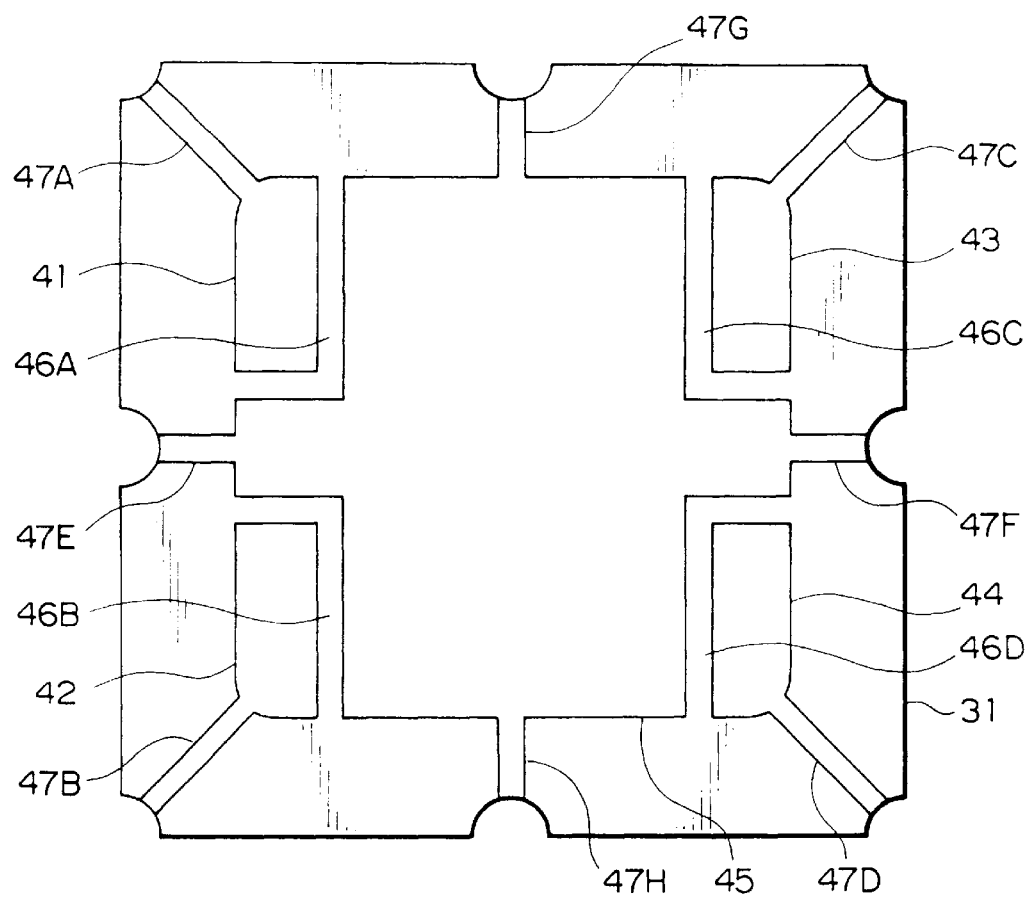
FIG. 3A is a plan view showing a conductor formation surface of a base of a surface acoustic wave device involving one embodiment of the present invention.
Figure 3B:
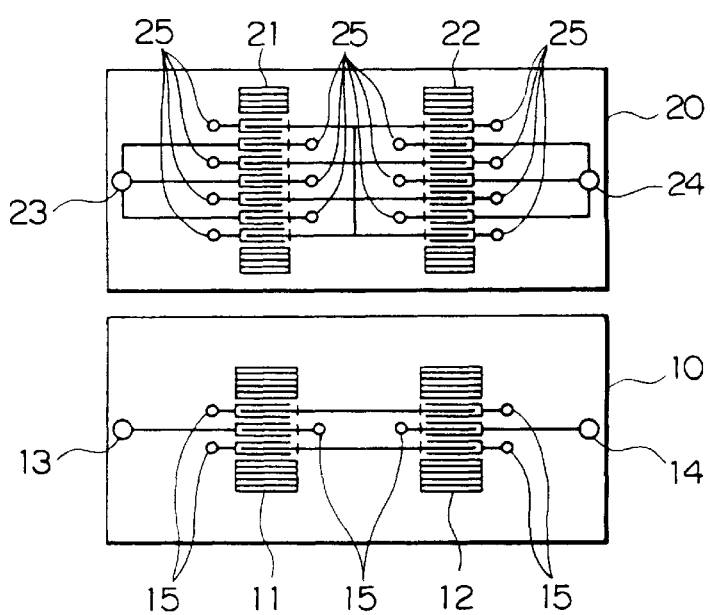
FIG. 3B is a plan view showing an electrode formation surface of a surface acoustic wave chip involving one embodiment of the present invention.
Figure 4:
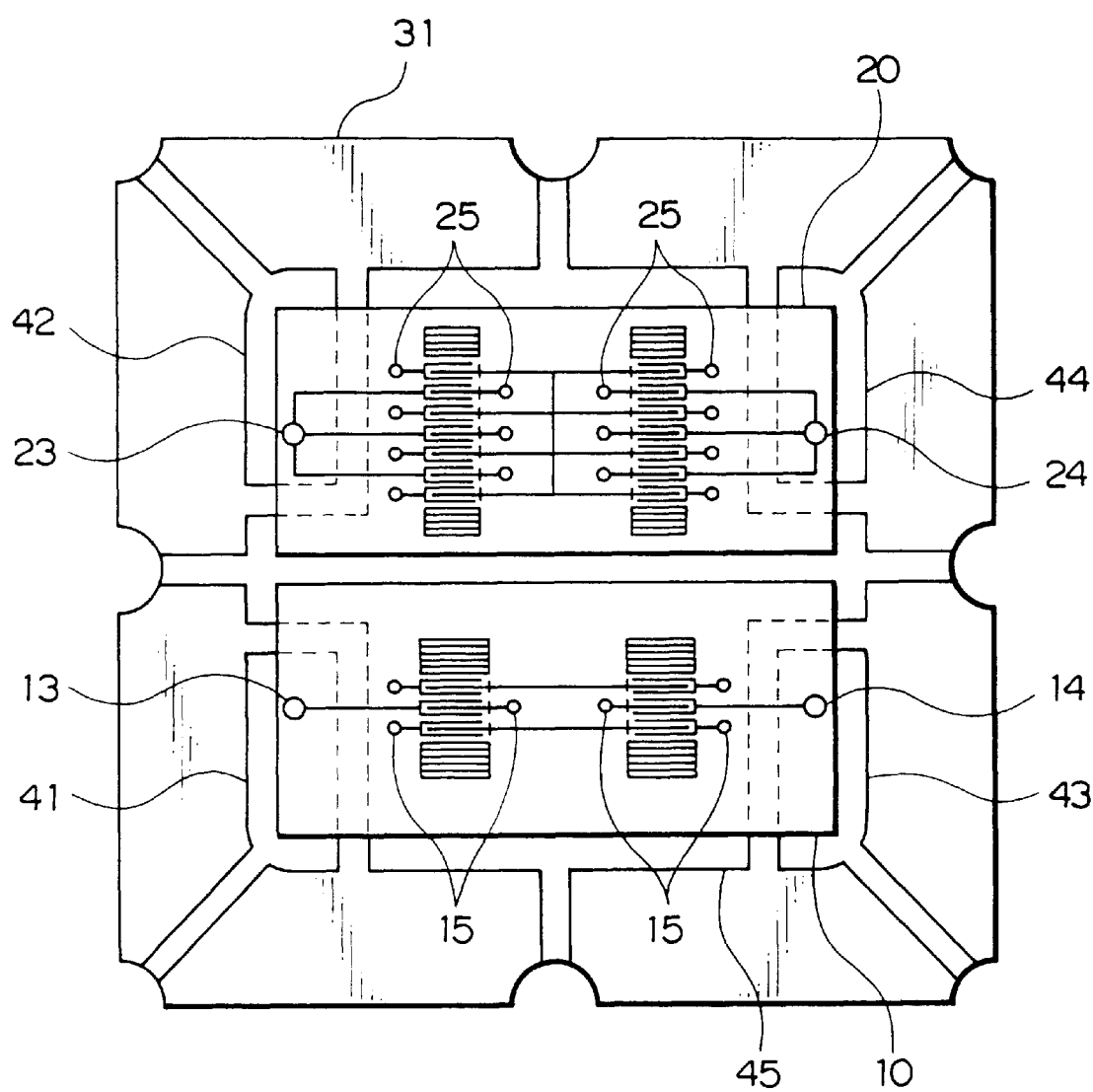
FIG. 4 is a perspective view seeing a surface acoustic wave device involving one embodiment of the present invention from a rear surface of a package with the surface acoustic wave chips stood out.

The details of the present embodiment are shown in FIGS. 3A and 3B and FIG. 4. FIG. 3A is a plan view showing a conductor formation surface thereon the conductor 40 of the base 31 is formed. FIG. 3B is a plan view that shows an electrode formation surface thereon electrodes of the surface acoustic wave chips 10 and 20 are formed. FIG. 4 is a perspective view seeing the package 30 therein the surface acoustic wave chips 10 and 20 are incorporated from a rear surface thereof with the chips 10 and 20 stood out. FIG. 4 shows an overturned state of FIG. 3A and is obtained by superposing FIG. 3A and FIG. 3B.

As shown in FIGS. 1 through 4, the base 31 is a rectangular plate. The base 31 is composed of ceramics or plastics. Here, the base 31 is provided with through-holes at four corners and at a center of each side.

In the neighborhood of a center of a surface thereon chips are mounted of the base 31 a conductor 40 consisting of a layer of metallic conductor is formed. The conductor 40 is constituted of signal conductors 41 to 44 and a ground conductor 45. The signal conductors 41 and 42 are conductor of input signal for inputting signals, and the signal conductors 43 and 44 are conductor of output signal for outputting signals. These conductors 41 to 45 are composed of the same layer each other and are separated insulated in the plain through slits 46A through 46D where the conductor is not formed.

The signal conductors 41 through 44 are formed at four corners of the entire conductor 40. The ground conductor 45 is formed in cross and part thereof is disposed intervened between the signal conductors 41 through 44. Thus, on areas between the signal conductors 41 through 44, the ground conductor 45 exists. Thereby, the signal conductors 41 through 44 are shielded from each other. As a result of this, signals on the signal conductors 41 through 44 are prevented from mingling each other.

The signal conductors 41 through 44 are electrically connected to conductors formed in through-holes with wiring 47A through 47D, respectively. To the ground conductor 45, wiring 47E through 47H are connected. The wiring 47E through 47H are electrically connected to the conductors formed in the through-holes, respectively.

As shown in FIGS. 1 through 4, the surface acoustic wave chips 10 and 20 are disposed on the base 31 so that each one side thereof is in approximate parallel with the other. These surface acoustic wave chips 10 and 20 constitute a lower band-pass filter and a higher band-pass filter, respectively.

The lower band-pass filter is constituted by connecting longitudinal mode-coupled surface acoustic wave resonant filters 11 and 12 in a cascade connection. On the other hand, the higher band-pass filter is constituted by connecting longitudinal mode-coupled surface acoustic wave resonant filters 21 and 22 in a cascade connection.

Here, in the longitudinal mode-coupled surface acoustic wave resonant filters 11 and 12, three IDT are arranged in rows in a propagation direction of surface acoustic waves and at both ends of the row reflectors are disposed to constitute a three IDT structure. In the longitudinal mode-coupled surface acoustic wave resonant filters 21 and 22, seven IDT are arranged in rows in a propagation direction of surface acoustic waves and at the both ends of the row reflectors are disposed to constitute a seven IDT structure. On the respective surface acoustic wave chips 10 and 20, these IDTs are disposed so that main propagation directions of surface acoustic waves are in parallel with each other.

To the longitudinal mode-coupled surface acoustic wave resonant filters 11 and 12, signal terminals 13 and 14 are connected, respectively, and to both ground terminals 15 are connected. To the longitudinal mode-coupled surface acoustic wave resonant filters 21 and 22, signal terminals 23 and 24 are connected, respectively, and to both ground terminals 25 are connected. Here, signal terminals 13 and 23 are signal terminals for inputting signals and signal terminals 14 and 24 are signal terminals for outputting signals.

The signal terminals 13 and 23 and signal terminals 14 and 24 are disposed so as to line on two opposing sides of the base 31, respectively, arrangement of the signal terminals 13 and 23 and arrangement of signal terminals 14 and 24 being in approximate parallel.

The terminals of input signals 13 and 23 or the terminals of output signals 14 and 24 of two chips are disposed to be on one side of the base 31, respectively. Thereby, connection with an external selection circuit can be implemented with ease.

When connecting these filters in serial within the package, a terminal of input signal of one filter and a terminal of output signal of the other filter are disposed so as to line on the same side of the base 31 to connect by a conductor on the base 31.

The surface acoustic wave chips 10 and 20 are bonded on the base 31 in a face down way to mount. That is, the signal terminals 13, 23, 14 and 24 of the surface acoustic wave chips 10 and 20 are connected to the signal conductors 41 through 44, respectively. Both of the ground terminals 15 and 25 of the surface acoustic wave chips 10 and 20 are connected to the ground conductor 45. All connection between the signal terminals 13, 23, 14 and 24 and the ground terminals 15 and 25, and the signal conductors 41 through 44 and the ground conductor 45 is implemented through bumps as mentioned above.

Here, as shown in FIG. 4, all IDTs, that is, the longitudinal mode-coupled surface acoustic wave resonant filters 11, 12, 21 and 22, are formed facing the ground conductor 45. That is, all the IDTs does not overlap with the signal conductors 41 to 44 on a plane. As a result of this, electrical signals can be prevented from mingling with the respective IDTs. If there is an IDT facing any one of the signal conductors 41 through 44, between the signal conductor and the IDT facing to each other, electromagnetic coupling occurs directly, the signal being likely to be mingled.

The ground conductor 45 is formed in a cross on the base 31 so that the extensions thereof are sandwiched between the adjacent signal conductors 41 to 44. Accordingly, in a dual-mode filter, even when the input to one filter is cut off from being inputted in the other filter, electromagnetic coupling between the signal conductor of one filter and the signal conductor of the other filter can be shielded due to the ground conductor 45. As a result of this, an influence of electromagnetic coupling between the conductor 40 to 44 can be alleviated to result in a surface acoustic wave device of low insertion loss.

In a surface acoustic wave device involving the present embodiment, two surface acoustic wave chips 10 and 20 having longitudinal mode-coupled resonant filters as such are bonded on the base 31 in a face down way to mount.

Accordingly, the values of capacitance parasitic to each IDT and inductance of the longitudinal-mode resonant filter can be alleviated in fluctuation. As a result of this, surface acoustic waves of higher mode can be efficiently extracted to result in a filter of wide band.

(Embodiment 2)

Figure 5A:
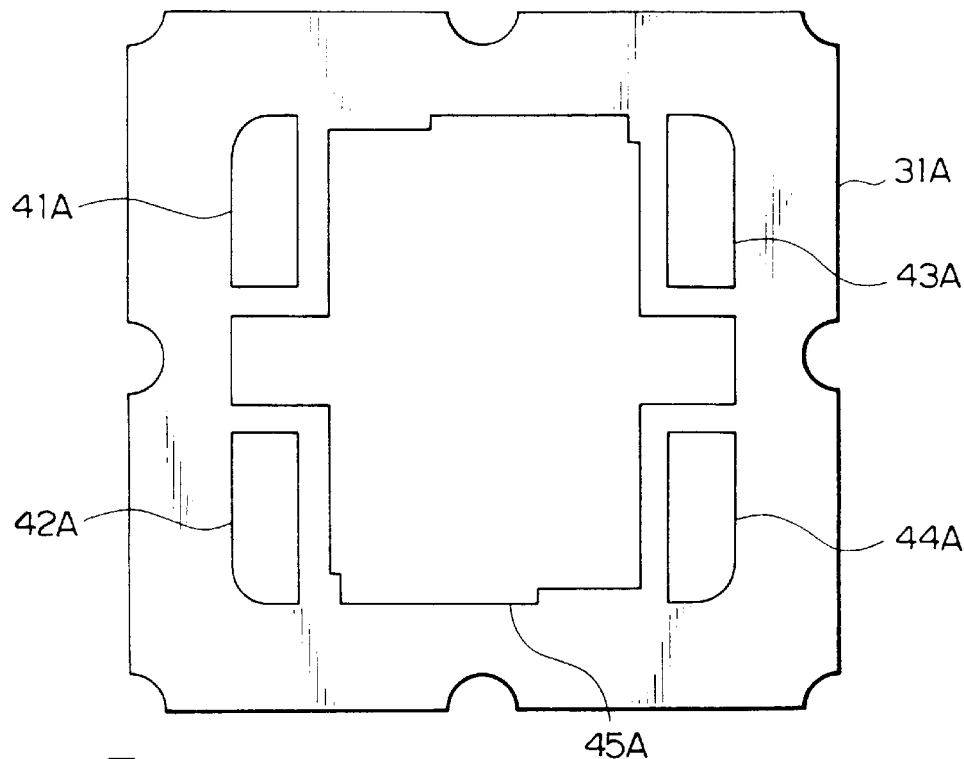
FIG. 5A and FIG. 5B are plan views showing conductor formation surfaces of bases of surface acoustic wave devices of one embodiment of the present invention.
Figure 5B:
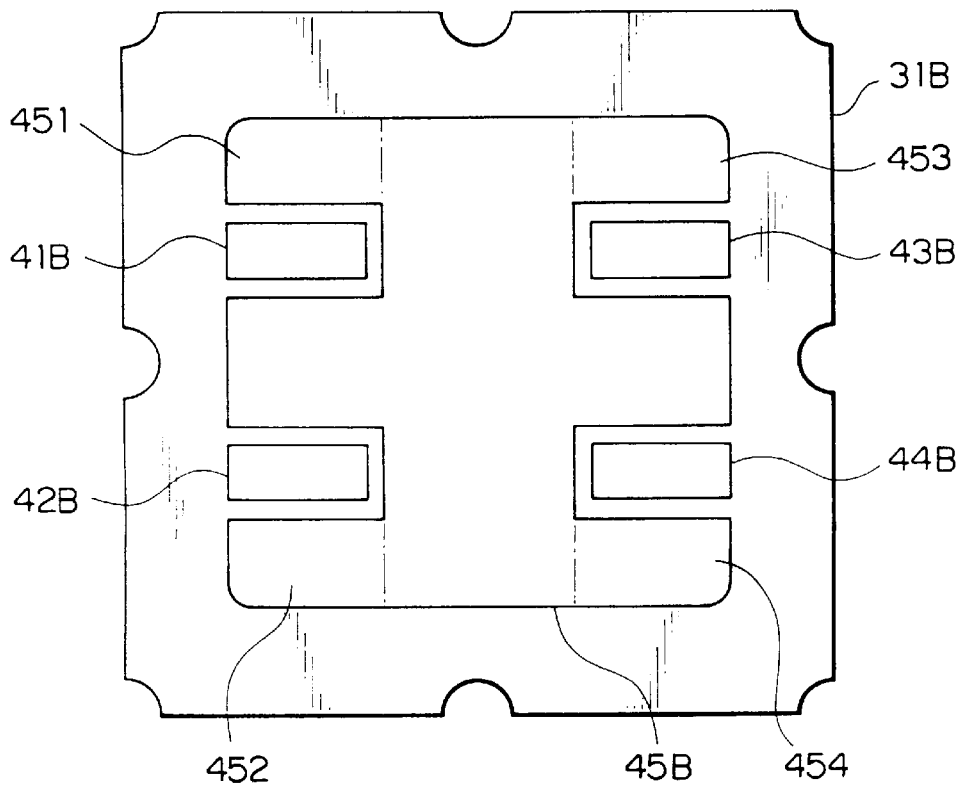

FIGS. 5A and 5B are plan views showing respectively states of planes of base 31A and 31B of which conductors are modified in their shapes. The bases 31A and 31B shown in these figures constitute part of a surface acoustic wave device involving a second embodiment of the present invention, respectively.

As shown in FIG. 5A, on the base 31A a conductor 40A consisting of signal conductors 41A to 44A and a ground conductor 45A is formed. Here, without showing wiring on the base 31A only conductor 40A is shown.

As obvious from comparison of FIG. 5A and FIG. 3A, in a ground conductor 45A, there are rectangular cuts at four corners of a square of a vertical direction in a paper plane constituting part of a cross. In spite of these cuts, the surface acoustic wave chips 10 and 20 can be similarly disposed with all IDTs, that is, the longitudinal mode-coupled surface acoustic wave resonant filters 11, 12, 21, and 22 faced to the ground conductor 45A.

As a result of this, as identical with the first embodiment, the ground conductor 45 shields the longitudinal mode-coupled surface acoustic wave resonant filters 11, 12, 21 and 22 to result in prevention of noise from mingling.

Other than this being identical with the first embodiment, explanation is omitted.

As shown in FIG. 5B, on the base 31B squared signal conductors 41B to 44B are formed separated from each other and on areas between the signal conductors 41B to 44B there is a ground conductor 45B. Here too, without showing wiring on the base 31B only the conductor 40B is shown.

In the signal conductors 41B to 44B, three sides of a square except one side are adjacent to the ground electrode 45B, respectively. In other words, the circumferences of the signal conductors 41B to 44B are almost surrounded by the ground conductor 45B to result in stronger prevention of mingling of external noise and signals than the first embodiment.

Here, the ground conductor 45B can be considered one that is formed by adding four square conductors 451 to 454 cut by chain lines to a conductor of a cross.

As shown in FIGS. 3B, 5A and 5B although the ground conductor is fundamentally formed in a cross, but a little bit of addition or elimination of the cross can be allowable. The widths of the vertical and horizontal rectangles constituting a cross are not required to be the same.

(Embodiment 3)

In a third embodiment of a surface acoustic wave device, on one chip one longitudinal mode-coupled resonant filter is formed. A plurality of longitudinal mode-coupled resonant filters is disposed on a base to form a multi-chip package.

Figure 6:
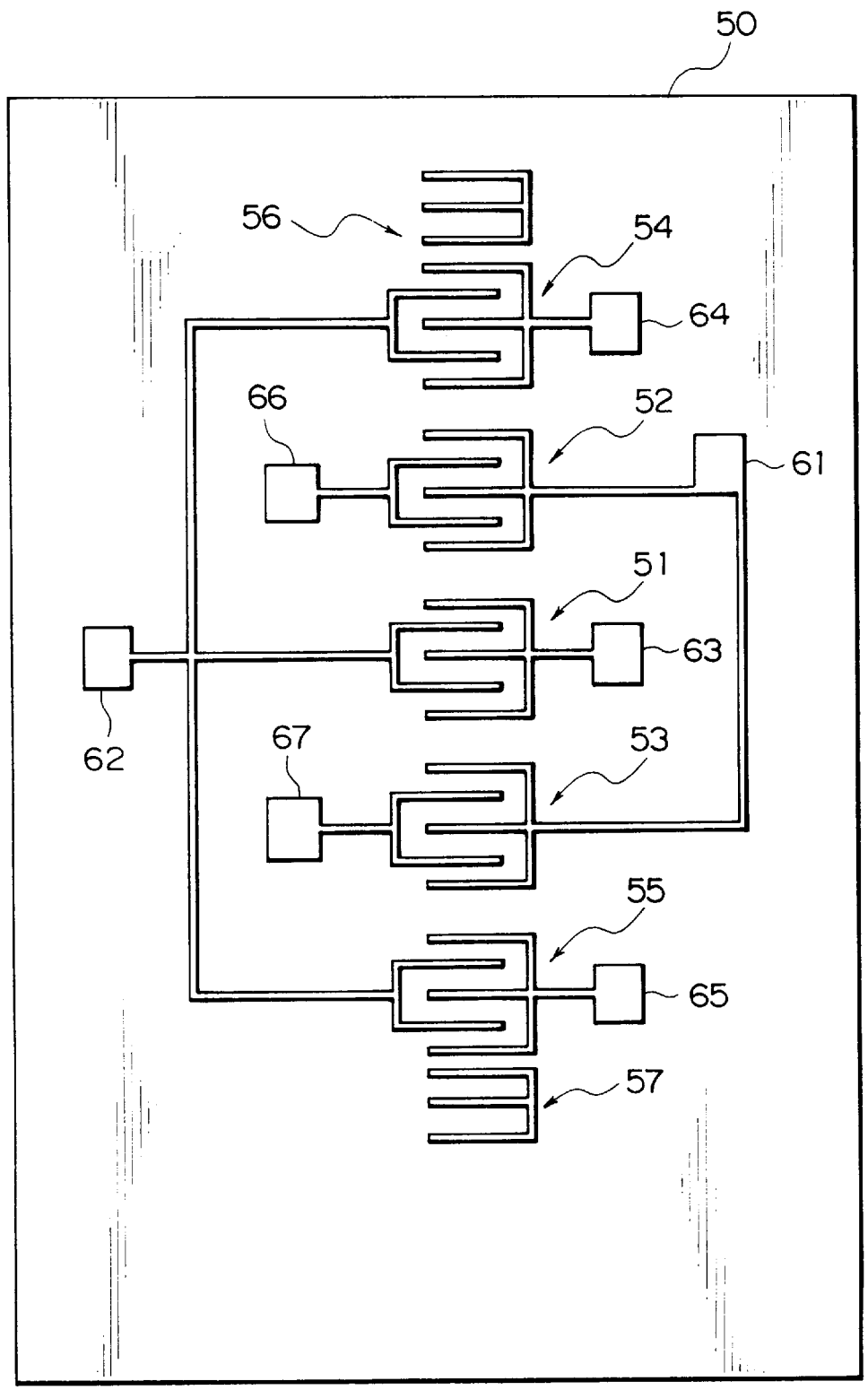
FIG. 6 is a plan view showing an electrode formation surface of a surface acoustic wave chip involving one embodiment of the present invention.

FIG. 6 is a plan view showing a 5IDT structure as an example of a longitudinal mode-coupled surface acoustic wave resonant filter. For example, the longitudinal mode-coupled surface acoustic wave resonant filters, as identical with the longitudinal mode-coupled surface acoustic wave resonant filters 11 and 12 of the surface acoustic wave chip 10 shown in FIG. 3B, can be connected in a cascade connection to form a filter.

On one main surface of a piezoelectric substrate 50, five IDT 51 through 55 are disposed in a row. At both ends of the five IDT 51 through 55, reflectors 56 and 57 are disposed. This is a so-called five IDT structure. Metallic strips constituting electrode fingers and the reflectors of these IDTs are composed of the same metallic layer, for instance, alloy strips mainly consisting of Al.

With this constitution, the longitudinal mode-coupled surface acoustic wave resonant filter can extract, together with the fundamental wave of surface acoustic waves, waves of higher mode of third order and fifth order, and can act as a filter of wide band.

The electrode fingers of the right-hand side of the IDTs 52 and 53 in the figure are connected in common to an input signal terminal 61. The electrode fingers of the left-hand side of the IDTs 51, 54 and 55 in the figure are connected in common to an output signal terminal 62. In addition, the electrode fingers of the IDTs 51, 54 and 55 on the right-hand side in the figure and the electrode fingers of the IDTs 52 and 53 on the left-hand side in the figure are connected to ground terminals 63 through 67, respectively.

In the present embodiment, the ground terminals 63 through 67 are formed as isolated terminals, respectively. As a result of this, by checking single chip, which IDT is wrong can be detected with ease. The ground terminals 63 through 67 can be connected integrally on the chip.

The ground terminals 63 through 67 can be disposed displaced from a direction of arrangement of filters. Thereby, bonding pads can be formed larger. As a result of this, the ground terminals 63 through 67 and the ground conductor 45 can be connected with higher reliability.

(Embodiment 4)

Figure 7:
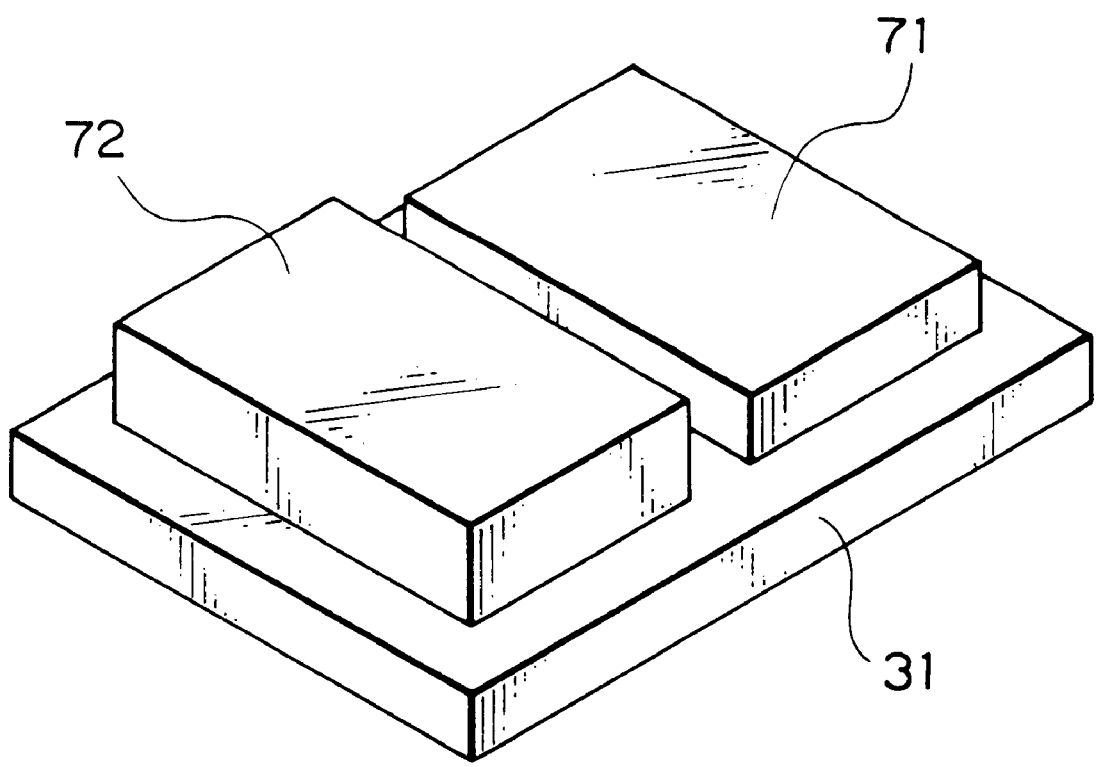
FIG. 7 is a perspective view showing a surface acoustic wave device involving one embodiment of the present invention.

FIG. 7 is a perspective view showing a surface acoustic wave device relating to the fourth embodiment of the present invention. As shown in the figure, on a base 31, two chips 71 and 72 of which piezoelectric substrates are different in their thicknesses are formed to constitute a surface acoustic wave device. With such a constitution, the surface acoustic wave chips of different characteristics can be formed in multi-chip.

Figure 8:
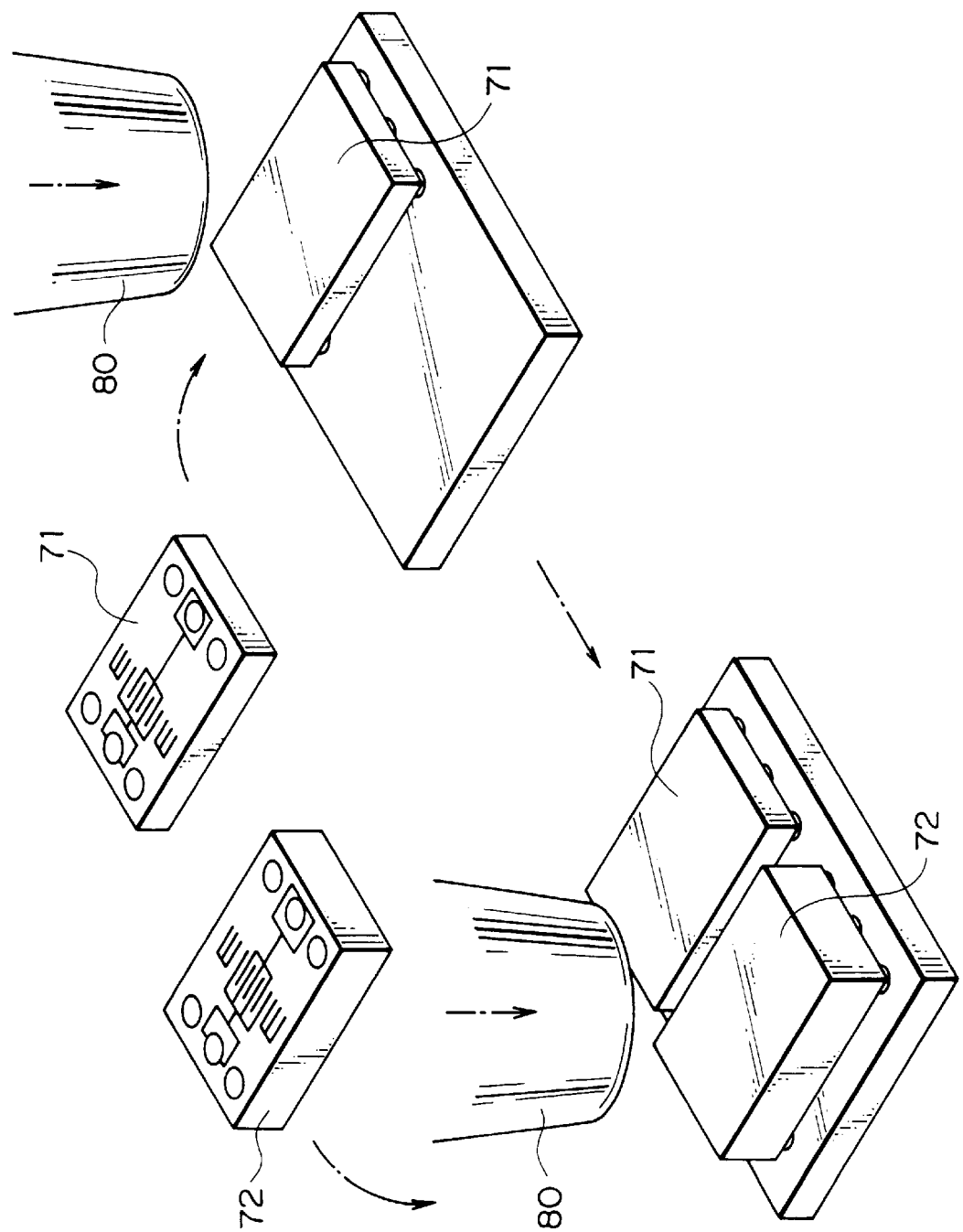
FIG. 8 is a perspective view showing mounting process of semiconductor chips involving one embodiment of the present invention.

As a method of mounting such chips of different thicknesses, the mounting method shown in FIG. 8 is preferable. That is, first a chip 71 of a substrate of a thinner thickness (for instance 0.35 mm) is mounted by flip-chip method with a tool 80. Thereafter, a chip 72 of a thicker substrate (for instance 0.5 mm) is mounted. At this time, as an example, bumps are Au bumps of a thickness of approximately 30 $\mu$m, the chip size is 1 mm×1.5 mm, and a tip end of the tool is 1.5 mm $\phi$.

The tool 80 has a tip end that can cover an entire upper portion of the chip. The tool 80 of such a size is aligned with a chip and is contacted therewith.

As a result of this, the chip can not be chipped off due to a contact of an edge of the tool. Force exerting on the chip is even to result in even bump connection.

The Au bump of a diameter of 30 $\mu$m used in this embodiment, during connection, collapses to approximately 20 $\mu$m. Here, the difference of thicknesses of the chip 72 that has a substrate of a thickness of 0.5 mm and is mounted second by flip-chip method and the chip 71 that is connected first and has a substrate of a thickness of 0.35 mm is 0.15 mm.

Accordingly, in mounting the chip 72, even when 20 $\mu$m of allowance of the thickness of a wafer and allowance of bumps are considered, the tool 80 and the chip 71 can be spaced with a sufficient gap.

Accordingly, even in mounting the second chip 72 by flip-chip method, the tip end of the tool 80 does not contact with the previously mounted chip 71. As a result of this, the previously mounted chip is not damaged in its connection.

(Embodiment 5)

Figure 9:
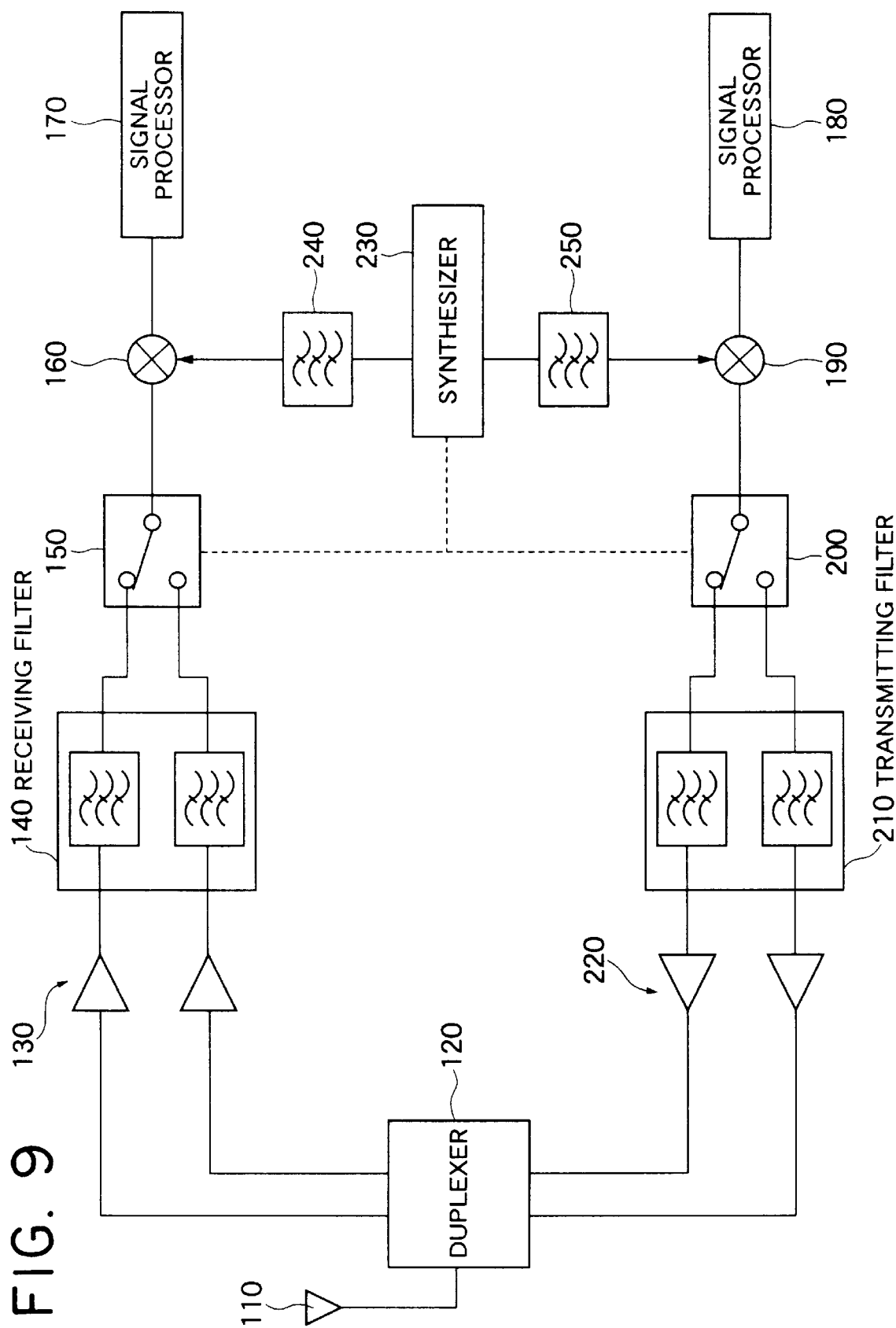
FIG. 9 is a block diagram of a radio communication unit involving one embodiment of the present invention.

FIG. 9 is a block diagram showing a radio-communication unit involving the fifth embodiment of the present invention. In this embodiment, a surface acoustic wave device is assembled in a radio-communication unit to process radio signals including two frequency bands.

Signals inputted through an antenna 110 are inputted through a duplexer 120 to a receiving line, and are inputted through amplifiers 130 corresponding to the respective frequency bands to a receiving filter 140. From signals outputted by the receiving filter 140, signals of one frequency band are selected by a switch 150. The selected signals are lowered to an intermediate frequency by a mixer 160 and inputted into a signal processor 170.

On the other hand, the signals outputted from a signal processor 180 are converted into signals of transmitting frequency by a mixer 190, signals of one frequency band being selected by a switch 200 to input into a transmitting filter 210. The signals that are outputted from the transmitting filter 210 are outputted through amplifiers 220 corresponding to the respective frequency bands and a duplexer 120 from an antenna 110. The switches 150 and 200 of the present embodiment constitute external selection circuits.

Here, oscillation signals that are outputted from a synthesizer 230 are inputted through a filter 240 or a filter 250 to mixers 160 or 190.

In the present embodiment, in the aforementioned receiving filter 140 and transmitting filter 210, signals of two frequency bands are processed. Accordingly, as a band-pass filter in each frequency band, the surface acoustic wave device shown in the first embodiment is used.

The surface acoustic wave device involving the present invention can be used as a duplexer 120.

OTHER EMBODIMENTS

Embodiment of the present invention is not restricted to the aforementioned embodiments. As long as being within the range of the technical idea of the present invention, it can be extended and modified. These extended or modified embodiments are also included in the present invention.

As examples of extension and modification, the following can be cited.

(1) Though two chips are used to constitute a surface acoustic wave device in the above embodiments, three or more chips can be used to constitute.

In this case too, all of the IDTs on the respective chips is preferable to face the ground conductor 45 on the base 31 so as to prevent signals and noise from mingling.

Further, on the area between signal conductors 41 to 44 on the base 31 part of the ground conductor 45 is preferable to exist. Furthermore, the signal conductors 41 to 44, except for one side or one edge thereof, are preferable to be surrounded in a state adjacent to the ground conductor 45.

(2) When surface acoustic wave chips of characteristics different to each other are used, the following methods can be considered for differentiating characteristics.

a. Substrate material of a piezoelectric substrate or a cut surface thereof is made different according to characteristics required for the respective chips.

For instance, of piezoelectric substrates such as 41Y and 64Y of $LiNbO_3$ and 36Y, 42Y and X-112Y of $LiTaO_3$, or quartz and $Li_2B_4O_5$, an appropriate combination can be selected.

b. External sizes of the chips are made different.

In this case, a plurality of chips of different length or different width can be used.

c. Conforming to characteristics required to each chip, thickness and material or the number of layer is made different.

d. The duty ratio (width of electrode fingers/pitch of electrode fingers) of electrode fingers is made different.

(3) The surface roughness of the rear surface of the substrate can be made different. In this case, the chips can be distinguished with ease.

What is claimed is:

1. A surface acoustic wave device, comprising:
   a package comprising a base on a first main surface thereof on which a plurality of signal conductors and a ground conductor are formed;
   a first surface acoustic wave chip disposed over the base in a face down way, comprising a plurality of first interdigital transducers formed on the first main surface of a first piezoelectric substrate, first signal terminals disposed on the first main surface, and a first ground terminal disposed on the first main surface;
   a second surface acoustic wave chip disposed over the base in a face down way, including a plurality of second interdigital transducers disposed on a second main surface of a second piezoelectric substrate, second signal terminals disposed on the second main surface, and a second ground terminal disposed on the second piezoelectric substrate; and
   wherein each of the first and the second signal terminals are bonded to each of the plurality of signal conductors through a bump, both of the first and the second ground terminals are bonded to the ground conductor in common through bumps, a plurality of portions of the ground conductor are projected between adjacent signal conductors, and each of the portions of the ground conductor is respectively connected to wiring.

2. The surface acoustic wave device as set forth in claim 1,
   wherein the first and the second surface acoustic wave chips are disposed, so that adjacent sides of the first and the second surface acoustic wave chips on which the first and the second signal terminals are not disposed are approximately parallel to each other;
   wherein the first and the second signal terminals are disposed, so that rows of the first and the second signal terminals disposed on each opposing side are approximately parallel to each other.

3. The surface acoustic wave device as set forth in claim 2,
   wherein all the first and the second interdigital transducers are facing the ground conductor.

4. The surface acoustic wave device as set forth in claim 1,
   wherein the plurality of signal conductors, except for one side thereof, are surrounded by a portion of the ground conductor.

5. The surface acoustic wave device as set forth in claim 1,
   wherein at least a portion of the ground conductor is formed in a cross.

6. The surface acoustic wave device as set forth in claim 1,
   wherein each of the first surface acoustic wave chip and the second surface acoustic wave chip has a plurality of ground terminals, and all the ground terminals are connected to the ground conductor in common through bumps.

7. The surface acoustic wave device as set forth in claim 1,
   wherein at least one chip of the first and the second surface acoustic wave chips includes a plurality of surface acoustic wave elements connected in a cascade connection.

8. The surface acoustic wave device as set forth in claim 1,
   wherein at least one chip of the first and the second surface acoustic wave chips comprises a longitudinal mode-coupled surface acoustic wave element.

9. The surface acoustic wave device as set forth in claim 8:
   wherein a longitudinal mode-coupled surface acoustic wave element comprises a plurality of interdigital tranducers of the same shape.

10. The surface acoustic wave device as set forth in claim 1, further comprising:
    an external selection circuit configured to supply input signals selectively to one of the first and the second surface acoustic wave chips.

11. The surface acoustic wave device as set forth in claim 1,
    wherein propagation characteristics of the first piezoelectric substrate is different from that of the second piezoelectric substrate.

12. The surface acoustic wave device as set forth in claim 1,
    wherein a thickness of electrode fingers constituting the first interdigital transducers is different from that of electrode fingers constituting the second interdigital transducers.

13. The surface acoustic wave device as set forth in claim 1,
    wherein electrode finger material constituting the first interdigital transducers is different from that constituting the second interdigital transducers.

14. The surface acoustic wave device as set forth in claim 1,
    wherein a duty ratio of electrode fingers constituting the first interdigital transducers is different from that of electrode fingers constituting the second interdigital transducers.

15. The surface acoustic wave device as set forth in claim 1, wherein an external dimension of the first surface acoustic wave chips is different from that of the second surface acoustic wave chip.

16. The surface acoustic wave device as set forth in claim 15,
wherein a thickness of the first piezoelectric substrate is different from that of the second piezoelectric substrate.

17. The surface acoustic wave device as set forth in claim 1,
wherein surface roughness of a rear surface of the first piezoelectric substrate is different from that of the second piezoelectric substrate.

* * * * *